United States Patent
Park et al.

(10) Patent No.: US 11,031,566 B2
(45) Date of Patent: Jun. 8, 2021

(54) METHOD FOR MANUFACTURING LAMINATE FOR ORGANIC-INORGANIC HYBRID SOLAR CELL AND METHOD FOR MANUFACTURING ORGANIC-INORGANIC HYBRID SOLAR CELL

(71) Applicant: LG CHEM, LTD., Seoul (KR)

(72) Inventors: Sang Jun Park, Daejeon (KR); Seiyong Kim, Daejeon (KR); Jong Seok Kim, Daejeon (KR); Yongnam Kim, Daejeon (KR); Deok Hwan Kim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 374 days.

(21) Appl. No.: 16/319,236

(22) PCT Filed: Jul. 20, 2017

(86) PCT No.: PCT/KR2017/007816
§ 371 (c)(1),
(2) Date: Jan. 18, 2019

(87) PCT Pub. No.: WO2018/016886
PCT Pub. Date: Jan. 25, 2018

(65) Prior Publication Data
US 2019/0280229 A1    Sep. 12, 2019

(30) Foreign Application Priority Data
Jul. 22, 2016    (KR) .................. 10-2016-0093702

(51) Int. Cl.
*H01L 51/42*    (2006.01)
*H01L 51/44*    (2006.01)

(52) U.S. Cl.
CPC ......... *H01L 51/4213* (2013.01); *H01L 51/42* (2013.01); *H01L 51/44* (2013.01); *Y02E 10/549* (2013.01)

(58) Field of Classification Search
CPC ..................................................... H01L 51/42
See application file for complete search history.

(56) References Cited

U.S. PATENT DOCUMENTS

| | | |
|---|---|---|
| 8,268,536 B2 | 9/2012 | Lee |
| 2007/0184576 A1 | 8/2007 | Chang et al. |
| 2008/0283389 A1 | 11/2008 | Aoki |
| 2011/0284068 A1 | 11/2011 | Moslehi et al. |
| 2013/0213690 A1 | 8/2013 | Lee et al. |
| 2014/0144501 A1 | 5/2014 | Jung et al. |
| 2015/0279573 A1 | 10/2015 | Horiuchi et al. |
| 2015/0287848 A1 | 10/2015 | Jun |
| 2016/0268510 A1 | 9/2016 | Moon et al. |
| 2017/0077403 A1 | 3/2017 | Lee et al. |

FOREIGN PATENT DOCUMENTS

| | | |
|---|---|---|
| JP | 2010161270 | 7/2010 |
| KR | 10-0991005 | 10/2010 |
| KR | 10-1021280 | 3/2011 |

(Continued)

*Primary Examiner* — Marvin Payen
(74) *Attorney, Agent, or Firm* — Dentons US LLP

(57) ABSTRACT

A method for manufacturing a laminate for an organic-inorganic hybrid solar cell, the method including forming a metal precursor layer by using a metal precursor solution, and forming a common layer and an electrode by applying a metal hydride onto the metal precursor layer.

12 Claims, 3 Drawing Sheets

(56) References Cited

FOREIGN PATENT DOCUMENTS

| | | |
|---|---|---|
| KR | 10-1144246 | 5/2012 |
| KR | 10-1345101 | 12/2013 |
| KR | 10-1373787 | 3/2014 |
| KR | 10-2015-0106858 | 9/2015 |
| KR | 10-1662885 | 10/2016 |
| WO | 2014119943 | 8/2014 |

[Figure 1]
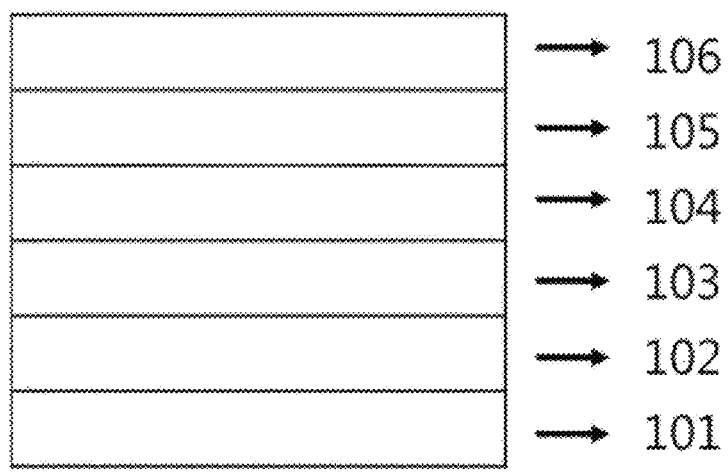
[Figure 2]
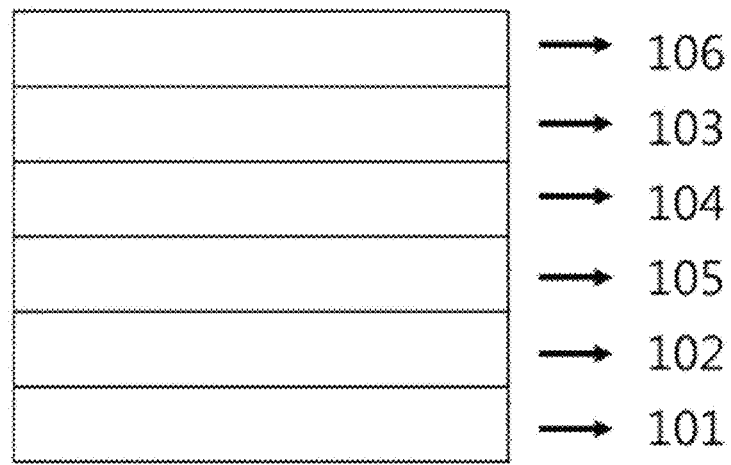

[Figure 3]
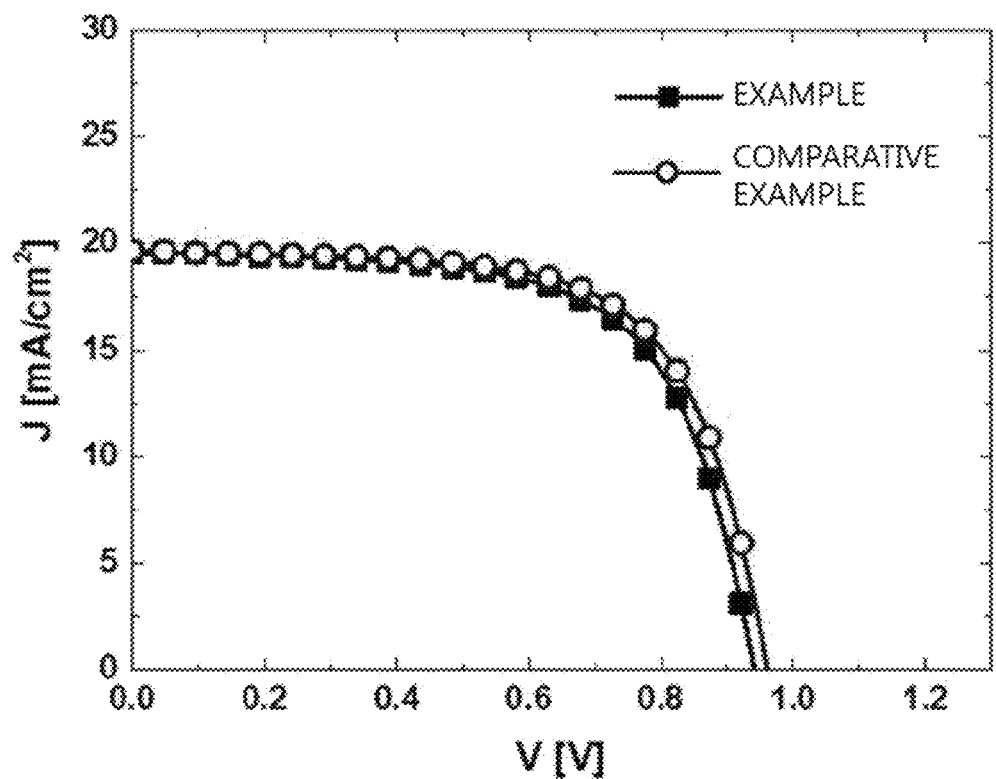
[Figure 4]
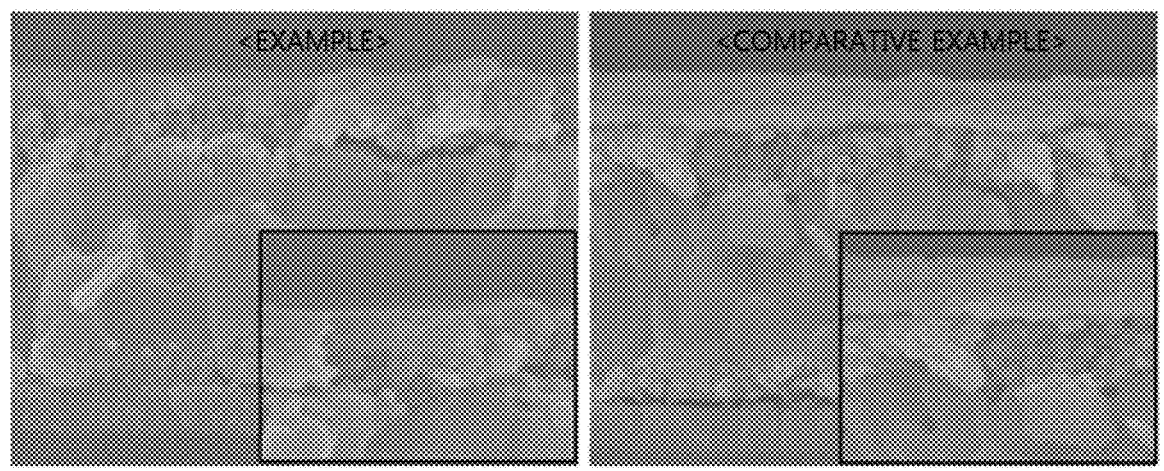

[Figure 5]
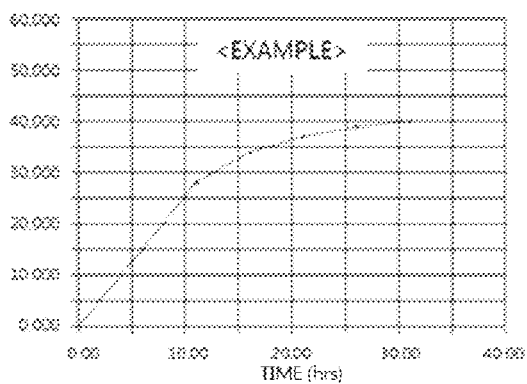
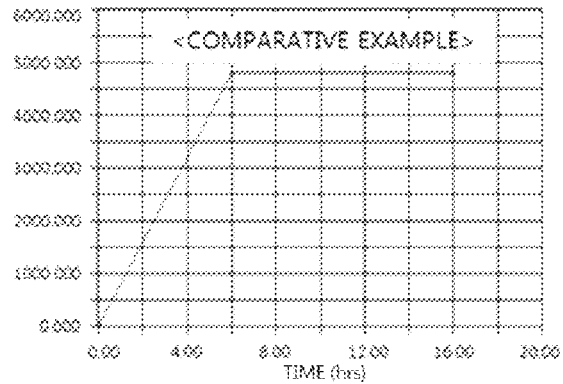

METHOD FOR MANUFACTURING LAMINATE FOR ORGANIC-INORGANIC HYBRID SOLAR CELL AND METHOD FOR MANUFACTURING ORGANIC-INORGANIC HYBRID SOLAR CELL

This application is a National Stage Application of International Application No. PCT/KR2017/007816 filed on Jul. 20, 2017, which claims priority to and the benefit of Korean Patent Application No. 10-2016-0093702 filed in the Korean Intellectual Property Office on Jul. 22, 2016, the entire contents of which are incorporated herein by reference in their entirety for all purposes as if fully set forth herein.

TECHNICAL FIELD

The present specification relates to a method for manufacturing a laminate for an organic-inorganic hybrid solar cell and a method for manufacturing an organic-inorganic hybrid solar cell.

BACKGROUND ART

In order to solve the global environmental problems caused by the depletion of fossil fuels and the use thereof, studies have been actively conducted on alternative energy sources, which may be regenerated and are clean, such as solar energy, wind power, and water power. Among them, interests in solar cells which change electric energy directly from the sunlight have been greatly increased. Here, the solar cell means a cell which produces current-voltage by using a photovoltaic effect of absorbing photoenergy from the sunlight to generate electrons and holes.

Organic-inorganic hybrid perovskite materials have recently drawn attention as a light absorbing material for organic-inorganic hybrid solar cells due to the characteristics in which the absorption coefficient is high and the material can be easily synthesized through a solution process.

In general, in the case of a process of an oxide applied to the manufacture of a common layer of an organic-inorganic hybrid solar cell, a method for treating a metal precursor at high temperature and applying the metal precursor to an oxide layer has been used. However, in this case, a process temperature at high temperature is needed, and it is difficult to implement a device having high efficiency. As another method, there is a method for coating and applying a solution in which metal oxide particles are prepared and dispersed, but in this case, the morphology of the common layer is non-uniform, so that it is difficult to apply a top electrode.

Meanwhile, as a method for forming a top electrode of an organic-inorganic hybrid solar cell, a method for depositing a metal material by a thermal deposition method or coating the metal material in the form of ink has been used. However, these methods have problems in that the performance is changed according to the surface morphology of a bottom common layer and a metal oxide is formed, or an insulating layer in the form of an organic material/metal composite is formed when the bottom common layer is formed of an organic material.

DETAILED DESCRIPTION OF THE INVENTION

Technical Problem

The present specification provides a method for manufacturing a laminate for an organic-inorganic hybrid solar cell and a method for manufacturing an organic-inorganic hybrid solar cell, which have simple manufacturing processes.

Technical Solution

An exemplary embodiment of the present specification provides a method for manufacturing a laminate for an organic-inorganic hybrid solar cell, the method including:
forming a metal precursor layer by using a metal precursor solution; and
forming a common layer and an electrode by applying a metal hydride onto the metal precursor layer.

Further, another exemplary embodiment of the present specification provides a method for manufacturing an organic-inorganic hybrid solar cell, the method including:
forming a first electrode;
forming a light absorbing layer on the first electrode;
forming a metal precursor layer on the light absorbing layer by using a metal precursor solution; and
forming a common layer and a second electrode by applying a metal hydride onto the metal precursor layer.

Advantageous Effects

According to a method for manufacturing a laminate for a solar cell according to an exemplary embodiment of the present specification, it is possible to expect to shorten a process time and reduce process costs because an inexpensive metal ink can be applied, and a metal precursor sufficiently fills pores of an oxide common layer so that an effect of improving water vapor transmission characteristics is added, and as a result, an additional process for enhancing water vapor transmission characteristics is omitted.

The method for manufacturing a laminate for a solar cell according to an exemplary embodiment of the present specification prevents formation of an organic-metal composite and a metal oxide insulating layer which may be generated between a common layer material and an electrode layer material, thereby improving the efficiency of an organic-inorganic hybrid solar cell.

BRIEF DESCRIPTION OF DRAWINGS

FIGS. 1 and 2 exemplify a structure of an organic-inorganic hybrid solar cell according to an exemplary embodiment of the present specification.

FIG. 3 illustrates a current density according to a voltage in each of the organic-inorganic hybrid solar cells manufactured in exemplary embodiments of the present specification.

FIG. 4 illustrates scanning electron microscope (SEM) images of the cross-section of each of the organic-inorganic hybrid solar cells manufactured in exemplary embodiments of the present specification.

FIG. 5 illustrates the water vapor transmission rate of each of the organic-inorganic hybrid solar cells manufactured in exemplary embodiments of the present specification.

101: Substrate
102: First electrode
103: Electron transporting layer
104: Light absorbing layer
105: Hole transporting layer
106: Second electrode

BEST MODE

Hereinafter, the present specification will be described in detail.

When one part "includes" one constituent element in the present specification, unless otherwise specifically described, this does not mean that another constituent element is excluded, but means that another constituent element may be further included.

When one member is disposed "on" another member in the present specification, this includes not only a case where the one member is brought into contact with another member, but also a case where still another member is present between the two members.

A method for manufacturing a laminate for an organic-inorganic hybrid solar cell according to an exemplary embodiment of the present specification includes: forming a metal precursor layer by using a metal precursor solution; and forming a common layer and an electrode by applying a metal hydride onto the metal precursor layer.

In the present specification, the common layer means an electron transporting layer or a hole transporting layer.

In the present specification, the laminate means a structure in which a common layer and an electrode are stacked.

According to an exemplary embodiment of the present specification, the forming of the common layer and the electrode includes a procedure in which the metal precursor layer is reacted with the metal hydride, so that the metal precursor layer is formed as a common layer and the metal hydride is formed as an electrode. That is, the forming of the common layer and the electrode includes a procedure in which the metal precursor layer is reacted with the metal hydride, so that the metal precursor layer becomes a common layer and the metal hydride becomes an electrode. At this time, the electrode is a metal electrode.

In the present specification, the procedure in which the metal precursor layer is reacted with the metal hydride, so that the metal precursor layer is formed as a common layer and the metal hydride is formed as an electrode may be a procedure in which an oxide common layer is formed during the reduction of the metal hydride.

In the present specification, the forming of the metal precursor layer is carried out at 150° C. or less. In general, in the case of an oxide process applied to the manufacture of the common layer, a metal precursor is treated at high temperature, and thus is applied to an oxide layer, and in this case, a material such as a substrate is thermally damaged, so that it is difficult to implement a device having high efficiency. The present specification has effects in that a plastic base material, for example, a flexible substrate such as polyethylene terephthalate (PET) may be applied, and a device having high efficiency may be implemented by preventing materials from being thermally damaged because the forming of the metal precursor layer is carried out at 150° C. or less.

In general, in order to form an electrode, a method such as thermal deposition, sputter coating, and vacuum deposition has been used, and in this case, there are problems in that a large amount of raw materials are lost, a lot of costs are consumed in order to manufacture and maintain facilities, and it is difficult to maintain process conditions. As a method for solving the problems, a prior art document (Korean Patent No. 10-1144246) describes that an electrode is formed by preparing an aluminum precursor ink in a metal precursor for a wet process. However, in the prior art document, an oxide precursor was used as a catalyst, the oxide precursor was not formed as an oxide layer, and finally, the prior art document failed to obtain effects of simultaneously improving processes of manufacturing a common layer and an electrode and improving the surface morphology of the common layer by using a system of placing an electrode manufactured of an aluminum film on an already manufactured common layer.

The method for manufacturing a laminate for an organic-inorganic hybrid solar cell according to the present specification includes a procedure in which a metal precursor layer is reacted with a metal hydride, so that the metal precursor layer is formed as a common layer and the metal hydride is formed as an electrode, and as a result, the common layer and the electrode are formed at one time, so that there is an effect in that the manufacturing process is simple and a device having high efficiency may be implemented.

Further, the method for manufacturing a laminate for an organic-inorganic hybrid solar cell according to the present specification has an effect in that the surface morphology of the common layer is improved.

In the present specification, the metal precursor solution includes one or more metal precursors among a titanium (Ti) precursor, a zinc (Zn) precursor, an indium (In) precursor, a tin (Sn) precursor, a tungsten (W) precursor, a niobium (Nb) precursor, a molybdenum (Mo) precursor, a magnesium (Mg) precursor, a zirconium (Zr) precursor, a strontium (Sr) precursor, a lanthanum (La) precursor, a vanadium (V) precursor, an aluminum (Al) precursor, a yttrium (Y) precursor, a scandium (Sc) precursor, a samarium (Sm) precursor, a gallium (Ga) precursor, and a composite thereof.

In the present specification, a precursor means a material in a step before the material becomes a specific material in any metabolism or reaction. For example, a metal precursor means a material in a step before the material becomes a metal material, and a metal precursor solution means a solution including a metal precursor.

According to an exemplary embodiment of the present specification, the content of the metal precursor in the metal precursor solution is 0.1 wt % to 5 wt %. Specifically, the content is 1 wt % to 5 wt %.

In the present specification, the metal precursor solution includes a solvent. Specifically, as the solvent, it is possible to use a ketone solvent such as toluene and methyl ether ketone; an acetate solvent; an aldehyde-based solvent such as dimethyl formaldehyde; and an ether-based solvent, and the like. More specifically, since a bottom layer perovskite absorbing layer is vulnerable to an alcohol-based solvent, an ether-based solvent such as dimethyl ether and diethyl ether may be used.

In the present specification, a bottom layer perovskite absorbing layer means a light absorbing layer including a perovskite material provided at the bottom of a laminate.

According to an exemplary embodiment of the present specification, the metal hydride includes a hydride of at least one metal among silver (Ag), aluminum (Al), platinum (Pt), tungsten (W), copper (Cu), molybdenum (Mo), gold (Au), nickel (Ni), and palladium (Pd). For example, the metal hydride may be an aluminum hydride.

In the present specification, a hydride means a two-element compound in which hydrogen combines with another element. For example, an aluminum hydride means that aluminum and hydrogen form a compound.

In the present specification, the metal precursor layer may be formed by a method such as spin coating, dip coating, spray coating, slit coating, and bar coating.

In the present specification, the forming of the common layer and the electrode by applying the metal hydride onto the metal precursor layer includes coating the metal hydride on the metal precursor layer by a method such as spin coating, dip coating, spray coating, slit coating, and bar coating.

According to an exemplary embodiment of the present specification, a method for manufacturing an organic-inorganic hybrid solar cell includes:

forming a first electrode;

forming a light absorbing layer on the first electrode;

forming a metal precursor layer on the light absorbing layer by using a metal precursor solution; and forming a common layer and a second electrode by applying a metal hydride onto the metal precursor layer.

At this time, forming an additional common layer may be further included between the forming of the first electrode and the forming of the light absorbing layer on the first electrode, and the common layer and the additional common layer may be each an electron transporting layer or a hole transporting layer. For example, the common layer may be an electron transporting layer and the additional common layer may be a hole transporting layer or the common layer may be a hole transporting layer and the additional common layer may be an electron transporting layer.

For example, in the present specification, the method for manufacturing an organic-inorganic hybrid solar cell may include: sequentially forming a substrate, a first electrode, an electron transporting layer, a light absorbing layer, a hole transporting layer, and a second electrode. FIG. 1 exemplifies a structure of an organic-inorganic hybrid solar cell manufactured according to an exemplary embodiment of the present specification. Specifically, FIG. 1 exemplifies a structure of an organic-inorganic hybrid solar cell, in which a first electrode 102 is provided on a substrate 101, an electron transporting layer 103 is provided on the first electrode 102, a light absorbing layer 104 is provided on the electron transporting layer 103, a hole transporting layer 105 is provided on the light absorbing layer 104, and a second electrode 106 is provided on the hole transporting layer 105.

For another example, the method for manufacturing an organic-inorganic hybrid solar cell may include: sequentially forming a substrate, a first electrode, a hole transporting layer, a light absorbing layer, an electron transporting layer, and a second electrode. FIG. 2 exemplifies a structure of an organic-inorganic hybrid solar cell manufactured according to an exemplary embodiment of the present specification. Specifically, FIG. 2 exemplifies a structure of an organic-inorganic hybrid solar cell, in which a first electrode 102 is provided on a substrate 101, a hole transporting layer 105 is provided on the first electrode 102, a light absorbing layer 104 is provided on the hole transporting layer 105, an electron transporting layer 103 is provided on the light absorbing layer 104, and a second electrode 106 is provided on the electron transporting layer 103.

In the present specification, the common layer may have a thickness of 10 nm to 200 nm.

According to an exemplary embodiment of the present specification, the forming of the light absorbing layer includes forming a perovskite material.

In the present specification, the perovskite material includes a structure of the following Chemical Formula 1.

$$AMX_3 \qquad \text{[Chemical Formula 1]}$$

In Chemical Formula 1,

A is a monovalent cation selected from $C_nH_{2n+1}NH_3^+$, $NH_{4+}$, $HC(NH_2)_{2+}$, $Cs^+$, $NF_{4+}$, $NCl_{4+}$, $PF_{4+}$, $PCl_4^+$, $CH_3PH_{3+}$, $CH_3AsH_{3+}$, $CH_3SbH_{3+}$, $PH_{4+}$, $AsH_{4+}$, and $SbH_{4+}$, M is a divalent metal ion selected from $Cu^{2+}$, $Ni^{2+}$, $Co^{2+}$, $Fe^{2+}$, $Mn^{2+}$, $Cr^{2+}$, $Pd^{2+}$, $Cd^{2+}$, $Ge^{2+}$, $Sn^{2+}$, $Pb^{2+}$, and $Yb^{2+}$, X is a halogen ion, and n is an integer from 1 to 9.

For example, the perovskite material may be $C_nH_{2n+1}NH_3PbI_3$ or $HC(NH_2)_2PbI_3$. For example, the perovskite material may be $CH_3NH_3PbI_3$ or $HC(NH_2)_2PbI_3$.

In the present specification, as the substrate, it is possible to use a substrate having excellent transparency, surface smoothness, handling easiness, and waterproofing property. Specifically, a glass substrate, a thin film glass substrate, or a plastic substrate may be used. The plastic substrate may include a film such as polyethylene terephthalate (PET), polyethylene naphthalate (PEN), polyether ether ketone, and polyimide in the form of a single layer or a multi-layer. However, the substrate is not limited thereto, and a substrate typically used for an organic-inorganic hybrid solar cell may be used.

In the present specification, the first electrode may be an anode, and the second electrode may be a cathode. Further, the first electrode may be a cathode, and the second electrode may be an anode.

In the present specification, the first electrode may be a transparent electrode, and the solar cell may absorb light by way of the first electrode.

In the present specification, when the electrode is a transparent electrode, as the electrode, it is possible to use an electrode in which a material having conductivity is doped on a flexible and transparent material such as plastic including polyethylene terephthalate (PET), polyethylene naphthalate (PEN), polypropylene (PP), polyimide (PI), polycarbonate (PC), polystyrene (PS), polyoxyethylene (POE), an AS resin (acrylonitrile styrene copolymer), an ABS resin (acrylonitrile butadiene styrene copolymer), triacetyl cellulose (TAC), polyarylate (PAR), and the like, in addition to glass and a quartz plate.

Specifically, the electrode may be indium tin oxide (ITO), fluorine doped tin oxide (FTO), aluminum doped zinc oxide (AZO), indium zinc oxide (IZO), ZnO—Ga₂O₃, ZnO—Al₂O₃, antimony tin oxide (ATO), and the like, and more specifically, ITO.

Furthermore, the first electrode may be a semi-transparent electrode. When the first electrode is a semi-transparent electrode, the first electrode may be manufactured of a semi-transparent metal such as silver (Ag), gold (Au), magnesium (Mg), or an alloy thereof. When a semi-transparent metal is used as a first electrode, the organic-inorganic hybrid solar cell may have a micro cavity structure.

In the present specification, the second electrode may be a metal electrode. Specifically, the metal electrode may include one or two or more selected from the group consisting of silver (Ag), aluminum (Al), platinum (Pt), tungsten (W), copper (Cu), molybdenum (Mo), gold (Au), nickel (Ni), and palladium (Pd).

In the present specification, the solar cell may further include an additional layer provided between the first electrode and the second electrode. Specifically, according to an exemplary embodiment of the present specification, the additional layer may include one or more selected from the group consisting of a hole injection layer, a hole transporting layer, an electron blocking layer, an electron transporting layer, and an electron injection layer.

In the present specification, a material for the hole transporting layer and/or the electron transporting layer may be a material which increases the probability that charges produced move to an electrode by efficiently transferring electrons and holes to a light absorbing layer, but is not particularly limited.

In the present specification, the electron transporting layer may include a metal oxide. As the metal oxide, it is possible to specifically use one or two or more selected from Ti oxide, Zn oxide, In oxide, Sn oxide, W oxide, Nb oxide, Mo oxide, Mg oxide, Zr oxide, Sr oxide, Yr oxide, La oxide, V oxide, Al oxide, Y oxide, Sc oxide, Sm oxide, Ga oxide, SrTi oxide, and a composite thereof, but the metal oxide is not limited thereto.

In the present specification, the electron transporting layer may improve characteristics of charges by using doping, and may modify a surface of the electron transporting layer by using a fluorene derivative, and the like.

In the present specification, the hole transporting layer may be an anode buffer layer.

The hole transporting layer may use tertiary butyl pyridine (TBP), lithium bis(trifluoro methanesulfonyl)imide (Li-TFSI), poly(3,4-ethylenedioxythiophene):poly(4-styrene-sulfonate) (PEDOT:PSS), nickel oxide (NiOx), and the like, but the material is not limited thereto.

In the present specification, the light absorbing layer may be formed by a method such as spin coating, slit coating, dip coating, inkjet printing, gravure printing, spray coating, doctor blade, bar coating, brush painting, and thermal deposition.

In the present specification, the organic-inorganic hybrid solar cell may have a wound structure. Specifically, the solar cell may be manufactured in the form of a flexible film, and may be made as a solar cell having a hollow wound structure by rolling the flexible film into a cylindrical form. When the solar cell has a wound structure, it is possible to install the solar cell in a way in which the solar cell is erected on the ground. In this case, it is possible to secure a portion in which the incident angle of light becomes a maximum while the sun moves from the east to the west at the position in which the solar cell is installed. Accordingly, while the sun is up in the sky, there is an advantage in that light may be absorbed as much as possible to increase the efficiency.

MODE FOR INVENTION

Hereinafter, the present specification will be described in detail with reference to Examples for specifically describing the present specification. However, the Examples according to the present specification may be modified in various forms, and it is not interpreted that the scope of the present specification is limited to the Examples described below in detail. The Examples of the present specification are provided to more completely explain the present specification to a person with ordinary skill in the art.

Example

A glass substrate (40 Ω/sq) coated with indium tin oxide (ITO) was washed in ethanol for 20 minutes by using an ultrasonic wave. An ITO substrate coated with an $NiO_x$ film (hereinafter, referred to as a hole transporting layer) was manufactured by spin-coating 2 wt % of a nickel oxide ($NiO_x$) dispersed solution (manufactured by Ditto, Inc.) on the aforementioned ITO substrate, and performing a heat treatment at 150° C. for 30 minutes.

In order to form a light absorbing layer, a dimethylformamide (DMF) solution in which $PbI_2$ at a concentration of about 40 wt % was dissolved was spin-coated on the hole transporting layer. Thereafter, a light absorbing layer was formed by spin-coating an isopropyl alcohol (IPA) solution in which $CH_3NH_3I$ (MAI) at a concentration of 4 wt % was dissolved, and then performing a heat treatment at 80° C. for 10 minutes.

A metal precursor layer was formed by spin-coating dibutyl ether in which titanium tetrachloride ($TiCl_4$) at a concentration of 2 wt % was dissolved on the light absorbing layer, and then performing a heat treatment at 100° C. for 5 minutes.

An electron transporting layer ($TiO_2$) was formed and an aluminum (Al) layer being a second electrode was formed on the electron transporting layer by dipping a film, in which a metal precursor layer for a hole transporting layer, a light absorbing layer, and an electron transporting layer was formed on the first electrode, in 50 mL of an aluminum precursor ink (manufactured by Alink Co., Ltd.) including a metal hydride for 1 hour, taking out the film, and performing a heat treatment at 100° C. for 30 minutes, thereby completing an organic-inorganic hybrid solar cell.

Comparative Example

A glass substrate (40 Ω/sq) coated with indium tin oxide (ITO) was washed in ethanol for 20 minutes by using an ultrasonic wave. An ITO substrate coated with an $NiO_x$ film (hereinafter, referred to as a hole transporting layer) was manufactured by spin-coating 2 wt % of a nickel oxide ($NiO_x$) dispersed solution (manufactured by Ditto, Inc.) on the aforementioned ITO substrate, and performing a heat treatment at 150° C. for 30 minutes.

In order to form a light absorbing layer, a dimethylformamide (DMF) solution in which $PbI_2$ at a concentration of about 40 wt % was dissolved was spin-coated on the hole transporting layer. Thereafter, a light absorbing layer was formed by spin-coating an isopropyl alcohol (IPA) solution in which $CH_3NH_3I$ (MAI) at a concentration of 4 wt % was dissolved, and then performing a heat treatment at 80° C. for 10 minutes.

An electron transporting layer was formed by spin-coating a solution in which 2 wt % of titanium dioxide ($TiO_2$) particles were dispersed on the light absorbing layer, and performing a heat treatment at 100° C. for 30 minutes.

Aluminum (Al) was vacuum deposited to a thickness of about 120 nm to about 150 nm on the electron transporting layer under a pressure of $10^{-8}$ torr to form a second electrode, thereby completing an organic-inorganic hybrid solar cell.

Table 1 shows the performance of each of the organic-inorganic hybrid solar cells according to exemplary embodiments of the present specification, and FIG. 3 illustrates a current density according to a voltage in each of the organic-inorganic hybrid solar cells manufactured in the exemplary embodiments of the present specification.

TABLE 1

|  | PCE (%) | $J_{sc}$ (mA/cm$^2$) | $V_{oc}$ (V) | FF (%) |
|---|---|---|---|---|
| Example | 12.0 | 19.6 | 0.941 | 65.1 |
| Comparative Example | 12.5 | 19.7 | 0.961 | 66.1 |

In Table 1, $V_{oc}$, $J_{sc}$, FF, and PCE mean an open-circuit voltage, a short-circuit current, a fill factor, and energy conversion efficiency, respectively. The open-circuit voltage and the short-circuit current are an X axis intercept and a Y axis intercept, respectively, in the fourth quadrant of the voltage-current density curve, and as the two values are increased, the efficiency of the solar cell is preferably increased. In addition, the fill factor is a value obtained by dividing the area of a rectangle, which may be drawn within the curve, by the product of the short-circuit current and the open-circuit voltage. The energy conversion efficiency may be obtained when these three values are divided by the intensity of the irradiated light, and the higher value is preferred.

The organic-inorganic hybrid solar cell manufactured in the Example had an energy conversion efficiency value of about 12%, and exhibited a performance at a level equivalent to that of the organic-inorganic hybrid solar cell in the Comparative Example, in which the second electrode was formed by an existing vacuum deposition method.

FIG. 4 illustrates scanning electron microscope (SEM) images of the cross-section of each of organic-inorganic hybrid solar cells manufactured in the exemplary embodiments of the present specification. In the case of the device manufactured in the Comparative Example, an interface between the aluminum thin film being the second electrode and the electron transporting layer thin film was noticeable, and a lifting interval confirmed as pores was exhibited, whereas in the case of the device manufactured in the Example, the aluminum thin film being the second electrode and the electron transporting layer thin film were too entangled with each other to differentiate the interface between the two thin films, and pores between the two layers were not confirmed.

FIG. 5 illustrates a result of measuring a water vapor transmission rate (WVTR) by forming an electron transporting layer and a second electrode laminate on a film in the same manner as the manufacturing method in the exemplary embodiments of the present specification. At this time, the water vapor transmission rate was measured by using an AQUATRAN-2 water vapor transmission rate measurement device manufactured by MOCON, Inc. The water vapor transmission rate of the laminate manufactured in the Comparative Example was about 4.87 g/m² day and exhibited a difference from $4.5 \times 10^{-2}$ g/m² day, which was the water vapor transmission rate of the laminate manufactured in the Example, by about $1 \times 10^{-2}$ g/m² day. That is, the laminate manufactured in the Example exhibited a water vapor transmission rate lower than that of the laminate manufactured in the Comparative Example. Through the results, it can be seen that the laminate manufactured by the solution process as in the Example may significantly increase the density as compared to a laminate made by a deposition process on the metal oxide common layer as in the Comparative Example.

The invention claimed is:

1. A method for manufacturing a laminate for an organic-inorganic hybrid solar cell, the method comprising:
   forming a metal precursor layer by using a metal precursor solution; and
   forming a common layer and an electrode by applying a metal hydride to the metal precursor layer.

2. The method for manufacturing a laminate for an organic-inorganic hybrid solar cell of claim 1, further comprising reacting the metal precursor layer with the metal hydride, so that the metal precursor layer becomes the common layer, and the metal hydride becomes the electrode.

3. The method for manufacturing a laminate for an organic-inorganic hybrid solar cell of claim 1, wherein the metal precursor solution includes one or more metal precursors selected from the group consisting of a: titanium (Ti) precursor, a zinc (Zn) precursor, an indium (In) precursor, a tin (Sn) precursor, a tungsten (W) precursor, a niobium (Nb) precursor, a molybdenum (Mo) precursor, a magnesium (Mg) precursor, a zirconium (Zr) precursor, a strontium (Sr) precursor, a lanthanum (La) precursor, a vanadium (V) precursor, an aluminum (Al) precursor, a yttrium (Y) precursor, a scandium (Sc) precursor, a samarium (Sm) precursor, a gallium (Ga) precursor, and a composite thereof.

4. The method for manufacturing a laminate for an organic-inorganic hybrid solar cell of claim 1, wherein a content of the metal precursor in the metal precursor solution is 0.1 wt % to 5 wt %.

5. The method for manufacturing a laminate for an organic-inorganic hybrid solar cell of claim 1, the metal precursor layer is formed at 150° C. or less.

6. The method for manufacturing a laminate for an organic-inorganic hybrid solar cell of claim 1, wherein the metal hydride includes a hydride of at least one metal selected from the group consisting of: silver (Ag), aluminum (Al), platinum (Pt), tungsten (W), copper (Cu), molybdenum (Mo), gold (Au), nickel (Ni), and palladium (Pd).

7. A method for manufacturing an organic-inorganic hybrid solar cell, the method comprising:
   forming a first electrode;
   forming a light absorbing layer on the first electrode;
   forming a metal precursor layer on the light absorbing layer by using a metal precursor solution; and
   forming a common layer and a second electrode by applying a metal hydride to the metal precursor layer.

8. The method for manufacturing an organic-inorganic hybrid solar cell of claim 7, further comprising:
   forming an additional common layer after forming the first electrode and before forming the light absorbing layer on the first electrode.

9. The method for manufacturing an organic-inorganic hybrid solar cell of claim 7, wherein the common layer is an electron transporting layer or a hole transporting layer.

10. The method for manufacturing an organic-inorganic hybrid solar cell of claim 8, wherein the common layer is an electron transporting layer and the additional common layer is a hole transporting layer, or the common layer is a hole transporting layer and the additional common layer is an electron transporting layer.

11. The method for manufacturing an organic-inorganic hybrid solar cell of claim 7, wherein forming the light absorbing layer comprises forming a perovskite material.

12. The method for manufacturing an organic-inorganic hybrid solar cell of claim 7, wherein the common layer has a thickness of 10 nm to 200 nm.

* * * * *